United States Patent

Chand et al.

[11] Patent Number: 5,773,318
[45] Date of Patent: Jun. 30, 1998

[54] IN-SITU TECHNIQUE FOR CLEAVING CRYSTALS

[75] Inventors: Naresh Chand, Berkeley Heights, N.J.; Robert Alan Hamm, Staten Island, N.Y.

[73] Assignee: Lucent Technologies Inc., Murray Hill, N.J.

[21] Appl. No.: 723,660

[22] Filed: Oct. 30, 1996

[51] Int. Cl.$^6$ ................................................. H01L 21/304
[52] U.S. Cl. .................. 438/33; 438/462; 225/2
[58] Field of Search ............................ 438/33, 38, 460, 438/462, 464, 289, 386; 29/413; 225/2, 96.5

[56] References Cited

U.S. PATENT DOCUMENTS

| | | | |
|---|---|---|---|
| 5,171,717 | 12/1992 | Broom et al. | 438/33 |
| 5,310,104 | 5/1994 | Zaidel et al. | 225/2 |
| 5,629,233 | 5/1997 | Chand et al. | 438/33 |
| 5,665,637 | 9/1997 | Chand | 438/38 |
| 5,668,049 | 9/1997 | Chakrabarti et al. | 438/33 |

FOREIGN PATENT DOCUMENTS

| | | |
|---|---|---|
| 62-98684 | 5/1987 | Japan . |
| 1-69304 | 3/1989 | Japan . |

OTHER PUBLICATIONS

M. Ohta et al., J. Vac. Sci. technol. B 12(3)(1994)1705 "Ultrahigh vacuum atomic force microscope with sample cleaving mechanism", May 1994.

Primary Examiner—Charles L. Bowers, Jr.
Assistant Examiner—Leon Radomsky

[57] ABSTRACT

The specification describes techniques for cleaving crystal bodies, e.g. semiconductor laser bars, using thermostatic cleaving tools. Use of such tools allows the cleaving process to occur in an ultra high vacuum chamber without the use of mechanical devices activated from the exterior of the chamber. Cleaving occurs automatically and controllably by locally heating the cleaving tools, thereby deflecting the thermostatic element against the laser bar and causing fracture.

12 Claims, 2 Drawing Sheets

IN-SITU TECHNIQUE FOR CLEAVING CRYSTALS

FIELD OF THE INVENTION

This invention relates to methods for cleaving crystals in high vacuum and to deposit in-situ passivating layers on the cleaved crystal faces. It applies to a variety of technologies but is especially suitable for coating laser facets.

BACKGROUND OF THE INVENTION

The advent of the semiconductor laser followed the invention of the crystal laser and the gas laser both of which relied on a Fabry-Perot cavity, which is basically a pair of mirrors, to retain standing light waves for periods sufficient to stimulate light amplification. Semiconductor lasers rely also on a reflective cavity which is typically formed by mirrors on the ends of a semiconductor crystal. In the usual structure one mirror has high reflectivity (HR) and the other is partially transmitting, i.e low reflectivity (LR). In high performance lasers these mirrors perform the additional function of passivating the surfaces of the semiconductor device. The surfaces of the laser device that are exposed to high light flux are susceptible to degradation which has become a serious problem to overcome in producing devices with the extended lifetimes required in e.g. many communications applications. Facet degradation includes both catastrophic optical damage (COD) caused by intense optical flux and gradual erosion due to optically accelerated facet oxidation. The main cause of COD is local heating due to optical absorption and non-radiative recombination of optically generated carriers at the facets.

Problems of facet degradation have confronted laser device designers for years. Typically they become more critical as the device complexity and performance demands increase. The semiconductor materials used in advanced lightwave device technology are typically multilayer semiconductor crystals based on compounds of Ga, Al. and In with As, and P. The device structures have a variety of forms with both edge emitting and surface emitting configurations.

These high performance semiconductor lasers typically have facets that are produced by mechanically cleaving a semiconductor crystal. With appropriate applied force, crystals tend to fracture along crystallographic lines and the fracture face or facet is typically of near perfect quality. Efforts have been made to cut laser facets by various micromachining techniques such as laser machining, and by chemical processes such as etching. None of these have proved as effective, in terms of the quality of the facet, as mechanical cleaving.

Although mechanical cleaving produces a near perfect facet the newly exposed semiconductor surfaces begins to degrade instantly after cleavage, due to contaminants in the cleaving tool and exposure to air. Recognition of this degradation mechanism stimulated several reported approaches to overcome facet degradation. Among them are: ( i ) impurity induced lattice disordering ( IILD ) at the facet that increases the bandgap and thus reduces the optical absorption and facet heating ( see W. X. Zou et al, IEEE Photon. Technol. Lett 3, 400 (1991); ( ii ) growth of non-absorbing mirrors (NAM) on the laser facets (see H. Naito et al, J. Appl. Phys. 68, 4420 ( 1990) and M. Matsumoto et al, Jpn J. Appl. Phys. 32, L665 ( 1993); (iii ) facet treatment by sulfur or sulfur-based compounds (see S. Kamiyame et al, Appl. Phys. Lett. 58, 2595 ( 1991) and H. Kawanishi et al, Proceedings of the SPIE Symposium on Laser Diode Technology and Applications II, Vol. 1219, 309 (1990); and ( iv) cleaning or forming laser facets in high vacuum followed in situ by suitable passivation and LR/HR coating (see M.Gasser and E.E. Latta, U.S. Pat. No. 5,063,173 issued Nov. 5, 1991). All of these techniques have been used largely for the GaAs/AlGaAs/InGaAs material system. The IILD technique and the in-situ facet cleaning by plasma source are not suitable for phosphorus based materials like InP and InGaP due to physical damage caused by plasma ions.

Recent experience with 980 nm lasers for erbium-doped amplifiers has shown persistent degradation problems even in aluminum-free InGaAs/InGaP/GaAs lasers in which the InGaP cladding layer is lattice matched to GaAs. These lasers were expected to give an improved reliability and long term stability due to elimination of degradation resulting from oxidation of aluminum during fabrication. We find that these Al free lasers too are susceptible to facet degradation.

It is found that cleaving the crystal outside the vacuum even with immediate insertion of the cleaved crystals in the vacuum chamber is insufficient to avoid degradation of the semiconductor crystal facets. Even the use of known techniques, e.g. ( i ), ( ii ), and ( iii ) described above, that specifically address facet degradation, have generally been found inadequate.

The high vacuum cleaving technique (iv above), with in situ deposition of passivating layers, has proved promising. One difficulty with this technique is the mechanics and mechanical equipment required for cleaving the semiconductor crystals in an ultra-high vacuum apparatus. It requires a cleaving tool to be installed in the vacuum equipment with manipulation of the cleaving tool externally of the vacuum chamber through a vacuum seal. The mechanics of this process add to its complexity and reduce reliability. Improved methods of in-situ cleaving can significantly advance this technology.

SUMMARY OF THE INVENTION

We have discovered a cleaving technique that allows cleaving the semiconductor crystal in high vacuum and eliminates the need for manipulation of cleaving tools from the outside of the vacuum chamber through a vacuum seal. It relies on the properties of thermostatic metals, which bend or deflect proportionately with a temperature change. A moderate change in temperature activates the tool and cleaves the semiconductor bars. The overall cleaving fixture has several such tools for cleaving several bars at once. Once cleaving has occurred, through raising or lowering the temperature, a passivating coating is applied. The coating means, e.g. a beam flux of dielectric coating material, can be activated after cleaving or during cleaving.

DETAILED DESCRIPTION

Figure 1:
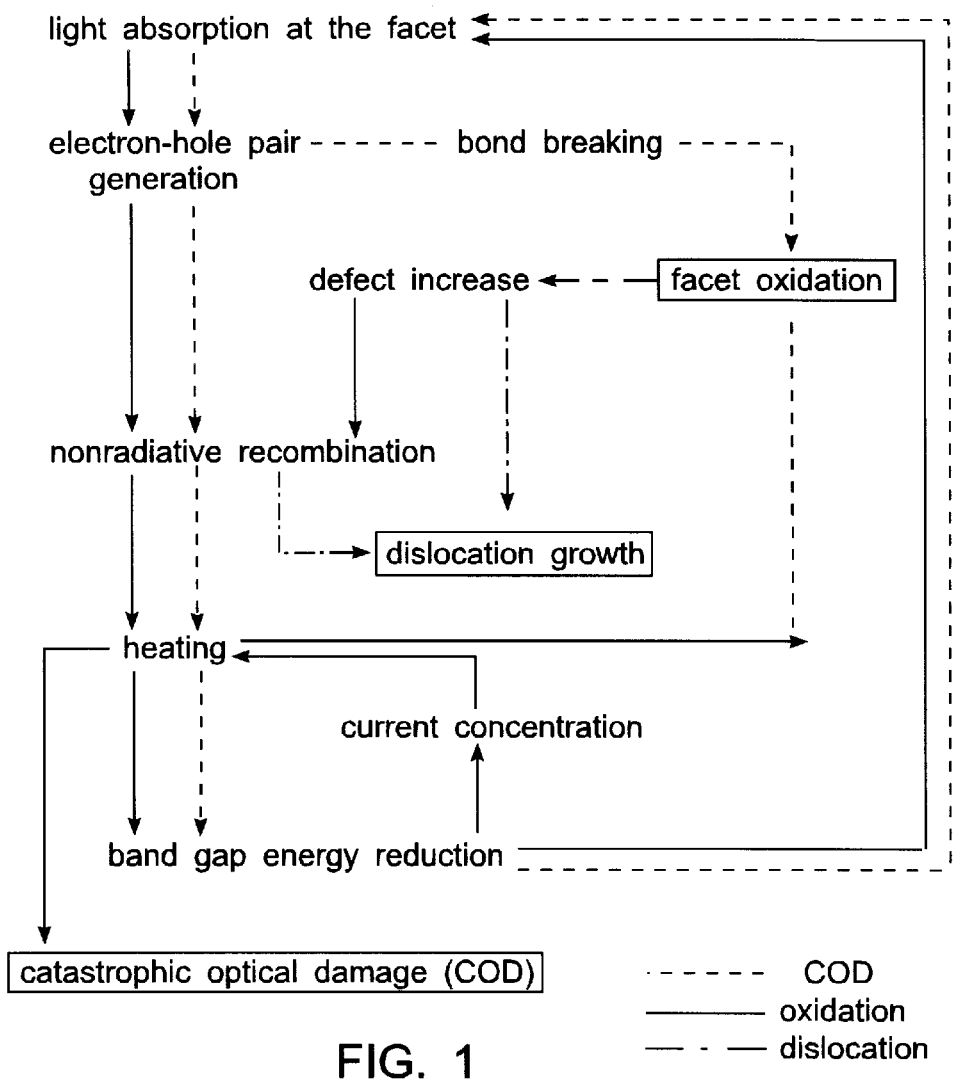
FIG. 1 is a schematic diagram of the facet degradation process.

Referring to FIG. 1, the degradation process of a typical laser facet is shown schematically. The facet of a laser usually has a large number of surface states due to facet oxidation or contamination when facets are formed in air. These states play a major role in the catastrophic optical damage (COD) mechanism. The maximum output optical power and the long term stability and reliability are limited by the COD.

The inventive technique can be practiced using the following methods.

Figure 2:
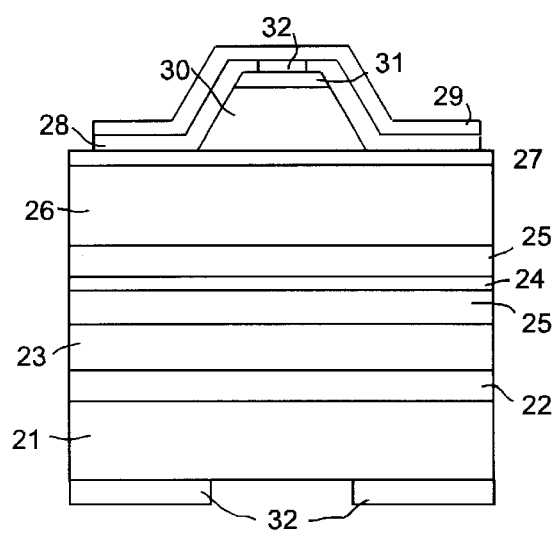
FIG. 2 is a schematic representation of a typical laser used in the cleaving process of the invention.

First, semiconductor lasers involving compounds comprising In, Ga, Al, P, As, are fabricated on GaAs or InP wafers by known techniques. A schematic cross-section of a typical laser structure is shown in FIG. 2. An n-type GaAs substrate is shown at 21 with 0.5 $\mu$m of n-type GaAs buffer layer 22, and 1.2 $\mu$m n-InGaP cladding layer 23. A 60 Angstrom active InGaAs quantum well layer 24 is shown bounded by 0.1 $\mu$m GaAs confinement layers 25. The p-type cladding layer, 1.1 $\mu$m of p-InGaP, is shown at 26. A 60 Angstrom p-GaAs stop etch layer is provided at 27, the contact structure comprising SiO$_2$ layer 28, 1.2 $\mu$m p - InGaP mesa 30, 0.12 $\mu$m p$^+$ GaAs 31, Ti/Pd/Au metallization 29, and AuBe/Ti/Au contact 32.

The wafers are cleaved into bars with the appropriate geometry for the desired laser devices. The bars are prepared for vacuum cleaving by scribing cleaving marks at the edges where the mirror facets are to be formed. While the technique provides advantages in cleaving one or both facets we found that the best results were obtained when both laser facets were formed according to the inventive process.

The basic element of the cleaving tool and its principle of operation is described in connection with FIG. 3. Here laser bar 35 is shown mounted with appropriate mounting means 36, which conveniently is a support member for multiple bars and has a design that allows easy insertion into a standard vacuum apparatus. The cleaving tool 37 is a cantilever strip of bimetallic metals. The head 38 of the tool 37 is positioned to bear against the laser bar to cleave the bar at the cleave mark 39. When initially mounted for cleaving the head 38 of the tool 37 may be spaced slightly from the laser bar 35 to allow for mounting the bar in the laser bar fixture. The cleave mark is formed at the edge prior to loading the laser bar in the vacuum apparatus. With the laser bar and cleaving tool in place in the vacuum apparatus (not shown) the cleaving tool is heated in the apparatus to cause the head 38 to come into contact with the laser bar at the appropriate position and apply sufficient force to cleave the laser bar at the cleave mark. The deflected position of the tool is shown in phantom and the cleaved portion of the laser bar is also shown in phantom.

Heating of the cleaving tool can be accomplished in a number of ways. An infra-red heating lamp, or a laser can be directed through a window in the vacuum chamber. Alternatively, a heating filament, shown at 34 in FIG. 3, is activated by an electrical switch external of the vacuum apparatus (not shown).

As is well known, a bimetallic strip is a strip of at least two metals with coefficients of thermal expansion that differ sufficiently to cause the strip to bend upon undergoing a temperature change. The amount of thermal deflection D$_T$ in inches at the end of a bimetallic cantilever beam depends on the length L in inches of free length, thickness t in inches of the beam, the flexivity value F$_L$ per degree C. of the beam material, and the temperature change $\Delta$T in degrees C., and are related by the formula:

$$D_T = 0.53 \, F_L \Delta T L^2 / t$$

The thermal force W in ounces generated upon deflection is dependent, in addition to those factors above, on the modulus M of the material in lbs per in$^2$, and the volume of material which is affected by the width w of the cantilever bar as well as t and L. These factors are related as follows:

$$W = 2.12 \, M \, F_L \, \Delta T w t^2 / L$$

The thermal force sufficient to cleave a typical laser bar is of the order of 1–3 ounces depending on the thickness and length of the bar and the size of the cleave mark. Other than to generate the required cleaving force the material of the bimetallic strip is not critical to the invention. It should be stable in the conditions in the vacuum apparatus both during cleaving and deposition of the initial passivation layer on the cleaved facets. Also the amount of deflection the cleaving tool is required to undergo is not critical and depends largely on the space between the tool head and the laser bar. If the tool head is virtually in contact with the laser bar the required excursion of the tool head is minimal.

Bi-metallic strips are well known in the art and a number of appropriate materials and strip configurations can be devised by those skilled in the art. An example appears in the following Table.

TABLE 1

| | strip 1 | strip 2 |
|---|---|---|
| dimensions | t = 0.25 mm | t = 0.25 mm |
| | w = 1.0 mm | w = 1.0 mm |
| | l = 12.5 mm | l = 12.5 mm |
| composition | 72% Mn | 66% Fe |
| | 18% Cu | 34% Ni |
| | 10% Ni | |

Figure 3:
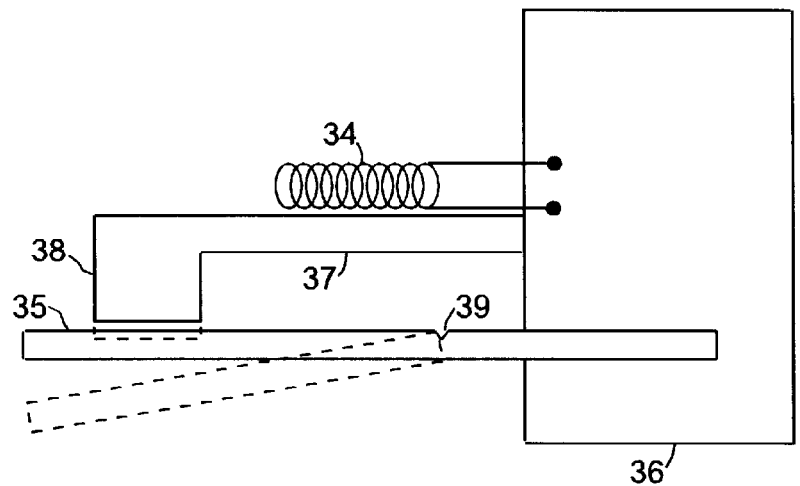
FIG. 3 is a schematic representation of a cleaving tool using thermostatic principles.

This bimetallic strip, mounted in a cantilever mode as shown in FIG. 3, will deflect approximately 0.4 mm upon heating to 50°C. The length of the head portion 34 is 1.5 mm, and the width is 0.5 mm. The head is designed to provide a convenient space between the cleaving tool and the sample being cleaved but does not materially affect the deflection properties of the cleaving tool. The force of this strip that is generated during deflection is approximately 3 ounces, easily sufficient to fracture a laser bar 50–250 microns in width, and 0.3 to 3.0 microns in thickness.

Figure 4:
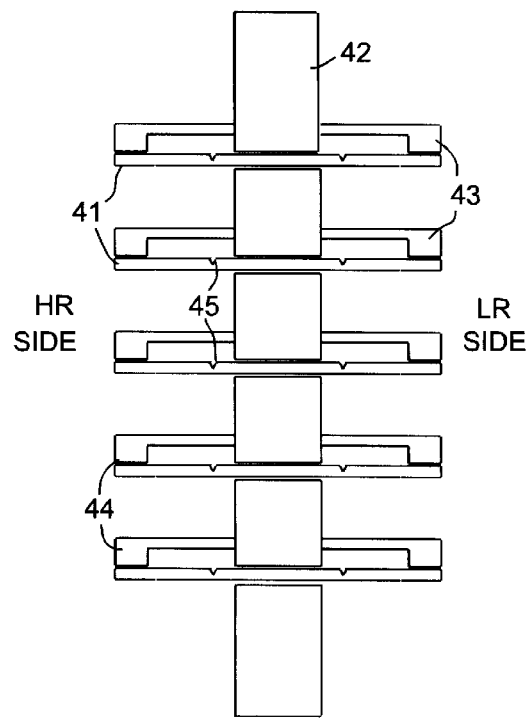
FIG. 4 is a representation of a fixture with a plurality of thermostatic tools according to the invention.

In commercial practice a plurality of cleaving tools would be used to cleave simultaneously a large number of laser bars. A suitable fixture for processing a batch of laser bars is shown in FIG. 4. This fixture and tooling is designed to cleave both ends of the laser bar at once and shows a plurality of laser bars 41 mounted on bar holder 42. The cleaving tools are designated 43 on the low reflectivity (LR) side and 44 on the high reflectivity (HR) side. The cleave marks are indicated at 45.

It is preferred that the fixtures and the vacuum apparatus be designed so that several fixtures can be loaded at a time into the vacuum apparatus. It may also be designed with a load lock separating the cleaving fixture site from the passivating coating location so that fixtures can be loaded and unloaded without breaking the vacuum in the deposition and buffer chambers. This allows continuous manufacture of passivated facets.

Figure 5:
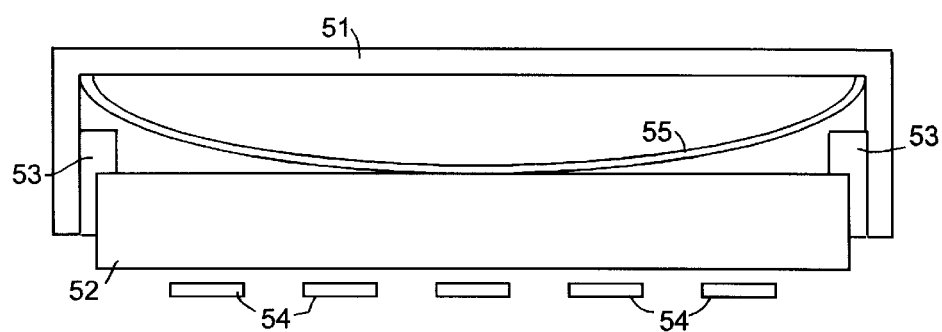
FIG. 5 is a representation of a alternative thermostatic tool arrangement operating in an alternative thermostatic mode.

The tool shown in FIG. 4 uses a thermostatic strip in a cantilever mode. An alternative arrangement designed to cleave a plurality of laser bars using a bimetallic strip in a different mode is shown schematically in FIG. 5. The cleaving tool in this embodiment has a single head actuated by a single bi-metallic strip to simultaneously cleave a plurality of laser bars. In FIG. 5 the cleaving tool 52 is shown slidably mounted on rails 53 in tool support 51. The laser bars are shown in end view at 54. The single bi-metallic strip is shown at 55. The bimetallic strip in this embodiment operates in a so-called simple mode. In this mode the thermal force factor is approximately four times the force factor for strips operating in the cantilever mode which effectively increases the efficiency of the applied force.

FIG. 5 demonstrates that a variety of configurations can be devised by those skilled in the art to implement the thermostatic cleaving process of the invention. Bi-metallic strips operate in several modes in addition to those described here. For example, thermostatic springs, e.g. coils, could be substituted for the simple thermostatic beam 55 in FIG. 5. Modifications of this kind are considered within the definition, for purposes of the invention, of thermostatic elements, or of the process of thermostatic activation of the cleaving tool.

After cleaving as above described the freshly cleaved mirror facets are passivated without exposure to air. The cleaved facets are transferred through a load lock to a deposition chamber, where a coating is applied. Alternatively the facets can be coated in the same chamber with the deposition source activated either during or immediately following cleaving.

The passivation layer should be nonabsorbing and should not react with the mirror facets. It must act as an effective barrier for diffusion of impurities from the oxide dielectric films that are capable of reacting with mirror facets. The passivation film should be deposited in an oxygen free environment. Materials suitable for passivation layers are Si, Ge, and ZnSe. Our preferred passivation material is ZnSe which meets all the requirements of a passivating film and has several advantages over other materials. It has a wide band gap of 2.75 eV and a nominal refractive index of 2.5 at 830 nm wavelength. ZnSe evaporates stoichiometrically at about 700° C. from an effusion cell. Evaporation at such a low temperature is highly desirable to minimize outgassing due to radiation heating from the chamber walls and other hardware in the evaporation system. The stoichiometric ZnSe has a lattice constant close to that of GaAs with a lattice mismatch of only 0.27% . The optimum sample temperature for epitaxial deposition of ZnSe on GaAs is only 300° C., and thus the thin film of ZnSe on laser facets ( which is not heated during deposition ) should be of relatively higher quality than those of materials like Si. ZnSe may also serve the purpose of a non-absorbing mirror. Appropriate thickness for the ZnSe layer is in the range of 30–100 A, and preferably approximately 50 A.

Immediately after deposition of the passivation film, SiO film for LR and HR coatings are deposited. For LR coating, SiO dielectric films with thickness <$\lambda$/4 to obtain a 2–5% reflectivity are suitable. Although SiO/ZnSe quarter wave stacks were found to be sufficient for HR coating, we prefer to use Si in place of ZnSe for the high refractive index layer in order to be compatible, as much as possible, with the usual commercial practice. As would occur to those skilled in the art, other materials may be used for the LR and HR coating, e.g. $Al_2O_3$, $Si_3N_4$, and yttrium stabilized zirconia ( YSZ).

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for cleaving a crystal body in a high vacuum chamber comprising the steps of:

mounting the crystal body in a high vacuum chamber, mounting adjacent the crystal body a cleaving device, said cleaving device comprising a thermostatic element and a bearing surface, closing the chamber and evacuating the chamber, and heating the cleaving device thereby causing the thermostatic element to deflect the bearing surface against the crystal body and fracture the crystal body.

2. The method of claim 1 in which the bearing surface is a portion of the thermostatic element.

3. The method of claim 1 in which the step of closing the chamber and evacuating the chamber creates an ultra high vacuum in the chamber.

4. The method of claim 3 further including the step of depositing a coating on at least one freshly cleaved surface of the crystal body without reducing the ultra high vacuum.

5. A method for the manufacture of a semiconductor laser comprising the steps of:

placing a semiconductor laser body in a vacuum deposition apparatus, evacuating the vacuum deposition apparatus to create a vacuum in the apparatus, cleaving the semiconductor laser body to form at least one freshly cleaved mirror facet on a surface of the laser body, and coating the freshly cleaved mirror facet with a passivating film without breaking the vacuum in the vacuum apparatus, the invention characterized in that the cleaving step comprises:

mounting a thermostatic cleaving tool in the vacuum deposition apparatus, said thermostatic cleaving tool comprising a thermostatic element and a bearing surface, said cleaving tool being mounted with the said bearing surface lying adjacent the portion of the semiconductor laser body to be cleaved, heating the thermostatic cleaving tool thereby causing the thermostatic element to deflect the bearing surface against the semiconductor laser body to cleave said body.

6. The method of claim 5 in which a multiplicity of thermostatic cleaving tools are mounted adjacent a multiplicity of semiconductor laser bodies, and said multiplicity of laser bodies are cleaved simultaneously.

7. The method of claim 5 in which one thermostatic cleaving tool is mounted adjacent a multiplicity of laser bodies and said multiplicity of laser bodies are cleaved simultaneously.

8. The method of claim 5 in which the thermostatic element comprises a bi-metallic cantilever beam.

9. The method of claim 7 in which the thermostatic element comprises a bimetallic simple beam.

10. The method of claim 5 in which the passivating coating is a material selected from the group consisting of Si, Ge, and ZnSe.

11. The method of claim 5 further including the step of depositing on said passivating film a reflective or anti-reflective coating.

12. The method of claim 6 in which two surfaces of each of said laser bodies are cleaved simultaneously.

* * * * *